United States Patent

Matsuzaki et al.

[11] Patent Number: 5,754,402
[45] Date of Patent: May 19, 1998

[54] POWER AMPLIFYING MODULE

[75] Inventors: Ken-ichiro Matsuzaki; Gaku Ishii; Kenji Otobe; Tatsuya Hashinaga, all of Yokohama, Japan

[73] Assignee: Sumitomo Electric Industries, Ltd., Osaka, Japan

[21] Appl. No.: 670,731

[22] Filed: Jun. 21, 1996

[30] Foreign Application Priority Data

Jun. 22, 1995 [JP] Japan .................. 7-156126
Sep. 28, 1995 [JP] Japan .................. 7-250987

[51] Int. Cl.$^6$ ........................................ H05K 7/20
[52] U.S. Cl. ............ 361/707; 257/711; 257/713; 361/715; 361/719; 361/761
[58] Field of Search ............ 174/16.3; 257/678, 257/706, 707, 711, 712, 713, 718; 361/704, 707, 709, 715, 717, 718, 719, 720, 722, 723, 730, 761

[56] References Cited

U.S. PATENT DOCUMENTS 4,135,168  1/1979  Wade .................. 331/108
4,227,036  10/1980 Fitzgerald ............ 174/16
5,398,160  3/1995  Umeda ................ 361/707

FOREIGN PATENT DOCUMENTS 175596  12/1991  Japan .

*Primary Examiner*—Gregory D. Thompson
*Attorney, Agent, or Firm*—Cushman Darby & Cushman IP Group of Pillsbury Madison & Sutro LLP

[57] ABSTRACT

A power amplifying module has at least one heat spreader mounted on a package substrate and exposed through a through hole provided in a wiring substrate, and at least one semiconductor chip forming a power amplifying circuit is mounted in a bare chip state on a surface of the at least one heat spreader as electrically connected to an electronic circuit pattern on the wiring substrate. Each of the package substrate and at least one heat spreader is made of a material having a thermal conductivity larger than that of a material making the wiring substrate. The module thus formed can emit the heat generated by the power amplifying module to the outside at high efficiency, thus achieving the power amplifying module with high performance and high reliability.

8 Claims, 7 Drawing Sheets

POWER AMPLIFYING MODULE

BACKGROUND OF THE INVENTION

1. Field of the Invention

The present invention relates to a power amplifying module and, more particularly, to a power amplifying module in which a package houses a wiring substrate electrically connected to a power amplifying circuit as incorporating a semiconductor chip.

2. Related Background Art

With a demand to compactify and highly functionalize electronic devices, electronic components incorporated in the electronic devices are being further compactified and highly functionalized these years. For example, the electronic components having come to be frequently used are those in the module form where a package houses a compact electronic circuit board formed by wiring a very small active element called as a so-called microchip, a passive element, or the like on an insulating substrate, for example including the power amplifying modules.

A conventional example of such module electronic components will be explained referring to FIGS. 10A and 10B. As shown in the exploded perspective view of FIG. 10A, an electronic circuit board is formed by connecting active elements 1 such as transistors and microchip passive elements 2 such as resistors or capacitors to wiring patterns (not shown) formed on an insulating wiring substrate 80, and a plurality of metal lead pins 83a–83d in a same shape are fixed to a side end of the wiring substrate 80.

Explaining the shape of the lead pin 83a as a representative example, a hook type fixing portion 84 for sandwiching the side end of the wiring substrate 80 is integrally formed with a leg 85 bent downward from the wiring substrate 80, and the fixing portion 84 is electrically connected to a predetermined portion of the wiring patterns. The reason why the leg 85 bent downward from the wiring substrate 80 is formed in this manner is that after a module is finally formed and when it is mounted to a substrate of various electronic devices, a clearance is formed so as to avoid contact of the bottom surface of the fixing portion 84 with the substrate of electronic device, thereby avoiding short circuit or the like of the fixing portion 84 with wiring patterns on the substrate of electronic device. Namely, since intervals of wiring patterns are becoming finer and finer in order to increase packaging density on the substrate of electronic device, connection to the wiring patterns is effected by only the leg 85 of the lead pin 83a and the clearance is secured so that the fixing portion 84 is free of contact with adjacent wiring patterns.

Further, a platelike package substrate 3 as shown in FIG. 10B is attached to the bottom surface of the wiring substrate 80. This package substrate 3 is bent at its both ends to form legs 4, 5 having the same height as the legs 85 of the lead pins 83a–83d. Therefore, when the finally formed module of electronic component is mounted on the substrate of various electronic devices, the wiring substrate 80 can be positioned in parallel on the substrate of electronic device, because the legs 85, 4, 5 of the lead pins 83a–83d and the package substrate 3 are formed at the same height.

Then the module of electronic component was finally formed by putting a box-shaped package cap 6 onto the wiring substrate 80.

However, because the legs 4, 5 of the package substrate 3 were formed by bending in the case of the module electronic component having the above structure, the package substrates 3 were not always obtained at a uniform height, which raised the following problems.

If the heights of the leg 4 and the leg 5 of the package substrate 3 are not equal to each other or if they are out of balance, play appears when it is placed on the substrate of various electronic devices, so as to make a clearance between either one leg of the lead pins 83a–83d and the wiring pattern on the substrate of electronic device and thus to cause failure of contact. On the contrary, if these lead pins were forced to be fixed to the wiring patterns on the substrate of electronic device by soldering or the like, undesirable mechanical stress would be exerted on the whole of package, on the wiring patterns, or on a part of device so as to cause deformation thereof, in turn raising a problem of degradation of electrical characteristics.

Also in the case where a heat radiating plate (not shown) was interposed in the gap between the bottom surface of package substrate 3 and the substrate of electronic device in order to enhance the heat radiation effect and where this heat radiating plate was arranged in direct and close contact with the bottom surface of package substrate 3 and the substrate surface of electronic device, occurrence of the above play degraded adhesion of the heat radiating plate thereto, which raised the problem of failure of obtaining the sufficient heat radiation effect.

The conventional power amplifying modules will be next described. In the conventional power amplifying modules, a semiconductor chip as an electronic component constituting an electronic circuit is packaged and thereafter the semiconductor chip packaged is mounted on the wiring substrate. This type of packaging technique improves moisture resistance and heat resistance on the basis of protection of semiconductor chip, and is classified under the air-tight sealing technique by ceramics or the like or the resin sealing technique by plastics or the like.

On the other hand, another practice is to mount the semiconductor chip in a bare chip state on the wiring substrate. This type of bare chip mounting technique is effective to compactification based on absence of package and to an improvement in performance because of absence of parasitic capacitance and inductance caused by the package.

Such prior art is described in detail, for example, in the publication "VLSI Packaging for Logic Devices" published by NIKKEI BP.

When a transistor called as a power amplifier is mounted as a semiconductor chip on the wiring substrate by the conventional bare chip mounting technology as described above, the power amplifier is electrically connected to the power amplifying circuit formed on the wiring substrate and generates a lot of heat because of its high output power characteristic. However, the wiring substrate usually has a relatively small thermal conductivity, because it is made, for example, of alumina, a glass epoxy resin, or the like except for the electronic circuit pattern forming the power amplifying circuit. Thus, it cannot emit the heat generated by the power amplifier to the outside. This caused the problem of lowering the operating speed and life of various electronic devices constituting the power amplifying circuit, and there was a problem that it was not easy to form high-performance power amplifying modules.

SUMMARY OF THE INVENTION

The present invention has been accomplished to solve the above problems, and an object of the invention is to provide a power amplifying module arranged to radiate the heat generated by the power amplifier to the outside at high efficiency so as to achieve high performance thereof.

The power amplifying module of the present invention is a power amplifying module comprising:

a wiring substrate on a principal surface of which an electronic circuit pattern is formed and in which at least one through hole is formed as penetrating between the principal surface and a back surface thereof;

a metal package substrate on which the wiring substrate is mounted;

at least one heat spreader mounted on the package substrate and exposed through the through hole provided in the wiring substrate;

at least one semiconductor chip mounted in a bare chip form on a surface of the at least one heat spreader and electrically connected to the electronic circuit pattern of the wiring substrate to form a power amplifying circuit; and a package cap for housing the wiring substrate inside and being fit with the package substrate, wherein each of the package substrate and the at least one heat spreader is made of a material having a thermal conductivity larger than that of a material of the wiring substrate.

In the power amplifying module of the present invention, the wiring substrate set inside the package is formed as provided with at least one through hole penetrating between the top surface thereof on which the electronic circuit pattern is formed and the bottom surface in contact with the inner surface of the package. The heat spreader and the semiconductor chip in a bare chip state are placed in order on the inner surface of the package exposed through the at least one through hole.

Since the semiconductor chip is electrically connected to the electronic circuit pattern of the wiring substrate to compose the power amplifying circuit, it generates a lot of heat because of its high output power characteristic when it operates as a power amplifier, based on various power supply. Here, because each of the package and heat spreader is made of the material having the thermal conductivity larger than that of the material making the wiring substrate, the heat generated by the semiconductor chip is rarely conducted to the wiring substrate, but it is conducted through the heat spreader and package in order so as to be emitted to the outside of package at high efficiency.

This can almost shields the various electronic devices, forming the power amplifying circuit together with the semiconductor chip as electrically connected to the electronic circuit pattern, from the heat generated by the semiconductor chip, and they can stably operate as being kept at a nearly constant temperature. Therefore, the power amplifying circuit constructed of the semiconductor chip and the electronic circuit pattern can demonstrate its high output power characteristic without degradation thereof.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
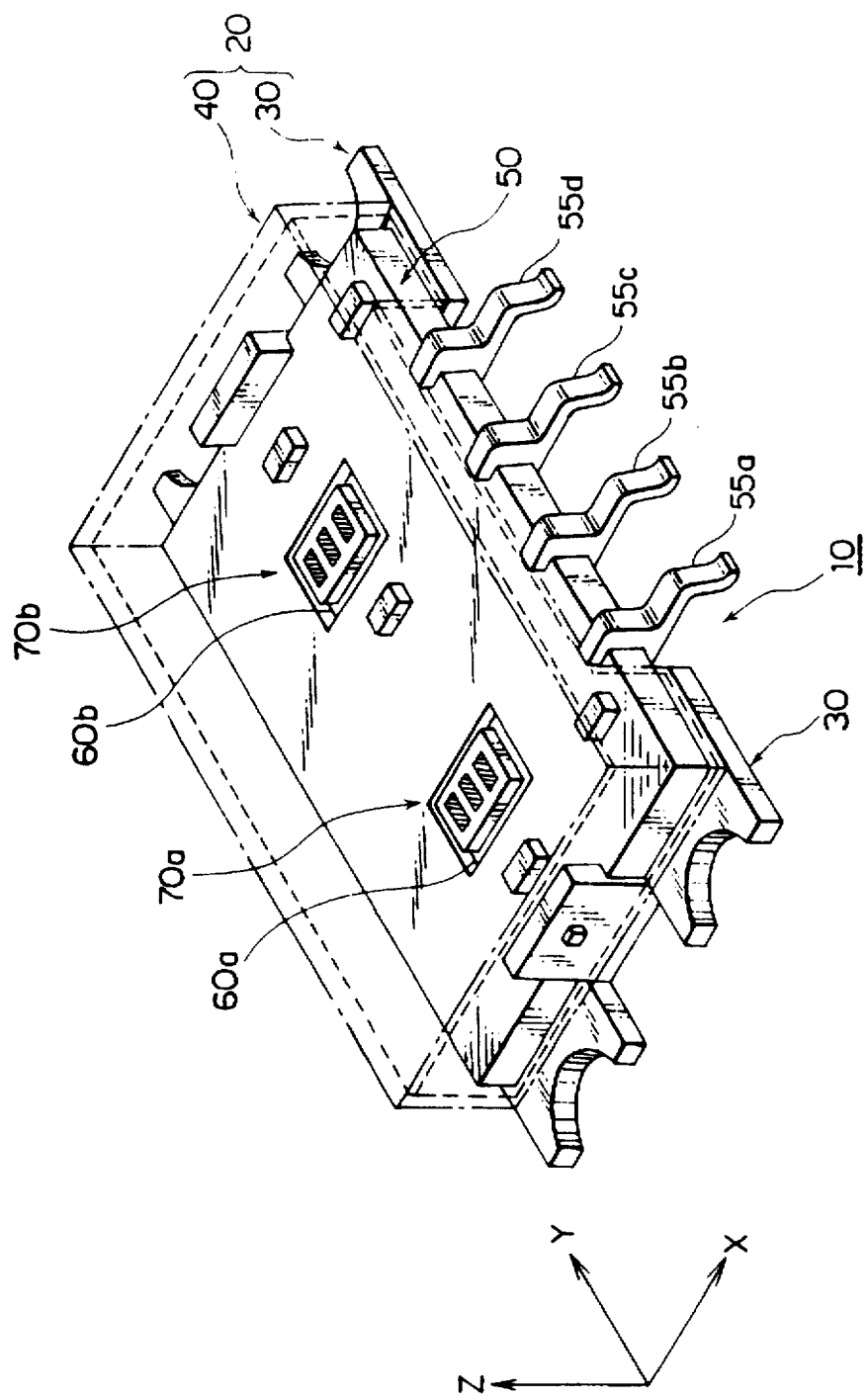
FIG. 1 is a perspective view to show the power amplifying module according to the present invention.

The embodiment of the power amplifying module according to the present invention will be explained with reference to the accompanying drawings. In the drawings, same reference numerals will denote same or equivalent portions and redundant description will be omitted.

Figure 2:
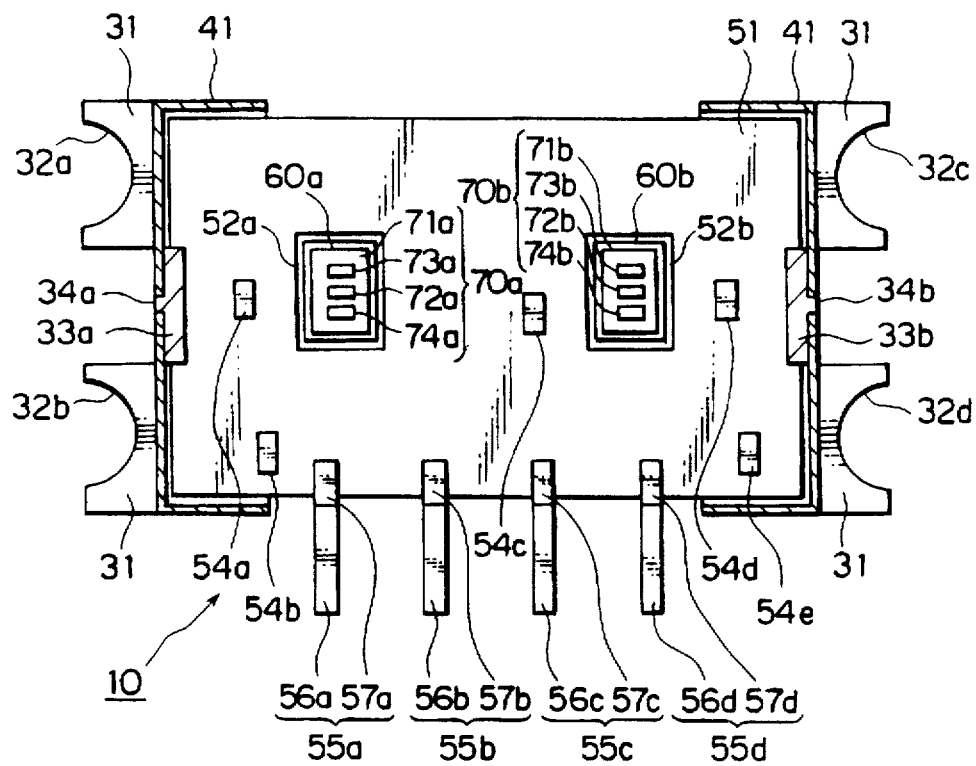
FIG. 2 is a sectional view of the power amplifying module, taken along the XY plane crossing through an upper part of the package cap in FIG. 1.
Figure 3:
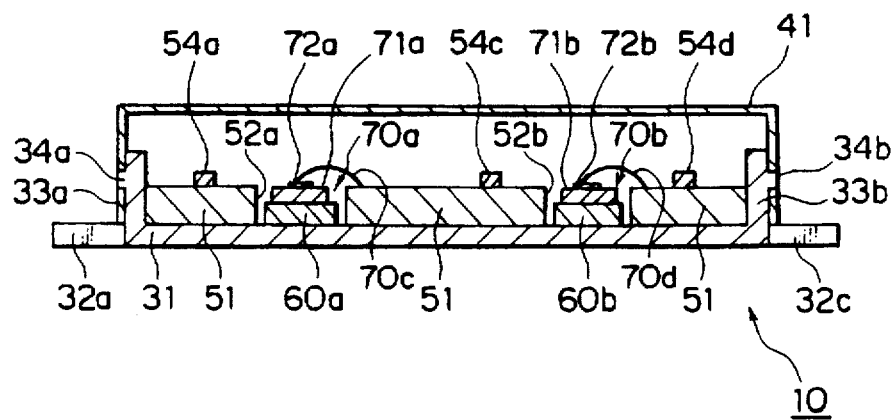
FIG. 3 is a sectional view of the power amplifying module, taken along the YZ plane including the center line extending in the longitudinal direction of FIG. 1.
Figure 4:
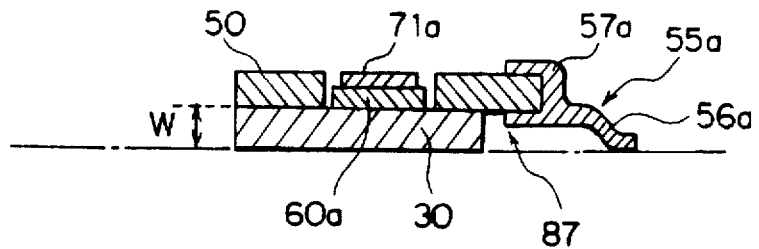
FIG. 4 is a sectional view of the power amplifying module, taken along the XZ plane shown in FIG. 1.

FIG. 1 is a perspective view to show the power amplifying module according to one embodiment of the present invention. FIG. 2 is a sectional view of the power amplifying module, taken along the XY plane crossing through the upper part of the package cap of FIG. 1. FIG. 3 is a sectional view of the power amplifying module, taken along the YZ plane including the center line extending along the longitudinal direction of FIG. 1 and FIG. 4 is a sectional view of the power amplifying module, taken along the XZ plane shown in FIG. 1. It is noted that the power amplifying module according to the present invention is applied to VHF-UHF band communication devices, and the like.

As shown in the figures, the power amplifying module 10 of the present embodiment is provided with a package 20 constructed by fitting a stem 30, being a nearly flat plate package substrate, with a cap 40, being a package cap of a nearly rectangular box shape. A wiring substrate 50 of a nearly flat plate shape is placed on the stem 30, and this wiring substrate 50 is covered by the cap 40. Two through holes 52a, 52b are formed in the wiring substrate 50, and two heat spreaders 60a, 60b of a nearly flat plate shape are placed on the stem 30 in the portions exposed through the through holes 52a, 52b. Two semiconductor chips 70a, 70b in a bare chip form are positioned on surfaces of these heat spreaders 60a, 60b.

Referring to FIG. 4, the wiring substrate 50 is disposed on the stem 30. The stem 30 is in close contact with the bottom surface of the wiring substrate 50, but the stem 30 is not contact with the lead pin 55a. The thickness W of the stem 30 is determined to be nearly equal to the height of the lower lead pin 56a of the lead pin 55a. Therefore, when mounting the power amplifying module on the substrate of an electronic device, the wiring substrate 50 becomes parallel to the substrate of the electronic device and a clearance 87 is formed between the lead pin 55a and the stem 30, which enables to avoid occurrence of electrical short circuit.

The wiring substrate 50 and the stem 30 are made of the respective materials having coefficients of linear expansion close to each other, as shown in the following table.

TABLE

| wiring substrate 50 | stem 30 |
|---|---|
| ceramic composite | Cu or CuZn |
| PPO or glass epoxy resin or Teflon composite | Al |
| $Al_2O_3$ | CuW or FeNi alloy |

Figure 5:
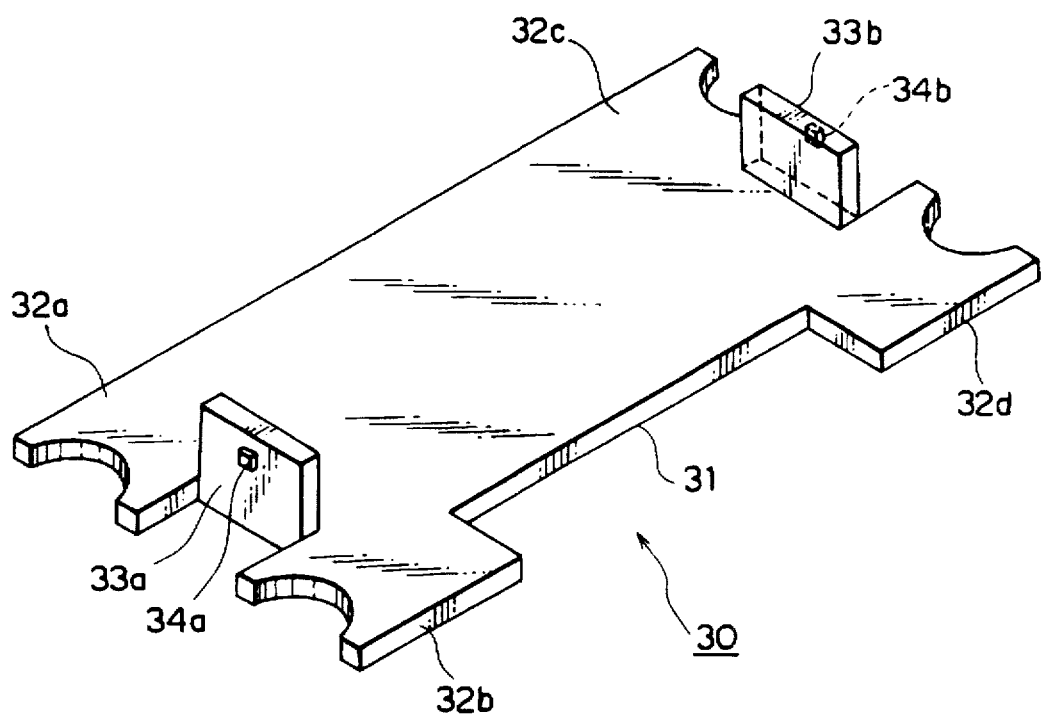
FIG. 5 is a perspective view to show the structure of the package bottom included in the power amplifying module of FIG. 1.

Next, as shown in FIG. 5, the stem 30 is a metal outer casing fitted to the cap 40 and is made of a material having a larger thermal conductivity than that of the substrate body 51 of the wiring substrate 50; for example, it is made of Cu or FeNi alloy. This stem 30 is composed of a substrate supporting portion 31 provided for supporting the wiring substrate 50 with a nearly rectangular principal plane thereof, and four cap supporting portions 32a, 32b, 32c, and 32d arranged to extend at the corner longitudinal ends of the substrate supporting portion 31.

The stem 30 is cut in a rectangular shape at an outside end portion in the transverse direction thereof, located between the two cap supporting portions 32b, 32d. The longitudinal outside ends of the stem 30 in the four cap supporting portions 32a–32d are cut in a nearly semi-circle shape.

Further, two substrate clamping portions 33a, 33b, each being bent in the normal direction to the cap supporting portions and being arranged to engage with two stem engaging portions 53a, 53b (FIG. 7) of the wiring substrate 50 so as to clamp the wiring substrate, are provided between the two cap supporting portions 32a, 32b and between the two cap supporting portions 32c, 32d, respectively. Two cap fitting portions 34a, 34b are formed on the longitudinally outside surfaces of these substrate clamping portions 33a, 33b as projecting outward, so that they can be fit in two stem fitting portions 43a, 43b provided in the cap 40 (FIG. 6) so as to hold them.

Figure 6:
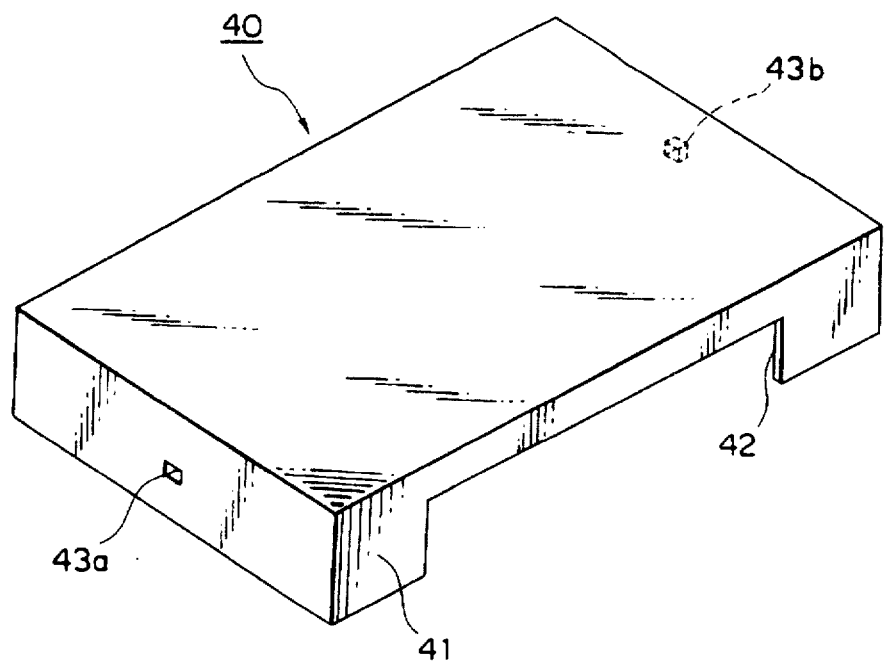
FIG. 6 is a perspective view to show the structure of the package cap included in the power amplifying module of FIG. 1.

Next, as shown in FIG. 6, the cap 40 is a metal outer casing having a hollow inside space, and is made of a material having a larger thermal conductivity than that of the substrate body 51 of the wiring substrate 50; for example, it is made of Cu or FeNi alloy. This cap 40 has a substrate cover portion 41 for covering and protecting the periphery on the top surface of the wiring substrate 50, and a lead pin passing portion 42 formed by cutting a side plate of the substrate cover portion 41 and permitting four input/output lead pins 55a–55d of the wiring substrate 50 to pass through. Further, the cap 40 has the two stem fitting portions 43a, 43b processed through the two side plates in the longitudinal direction of the substrate cover portion 41 and permitting the two cap fitting portions 34a, 34b of the stem 30 to fit therein, thereby holding them.

Figure 7:
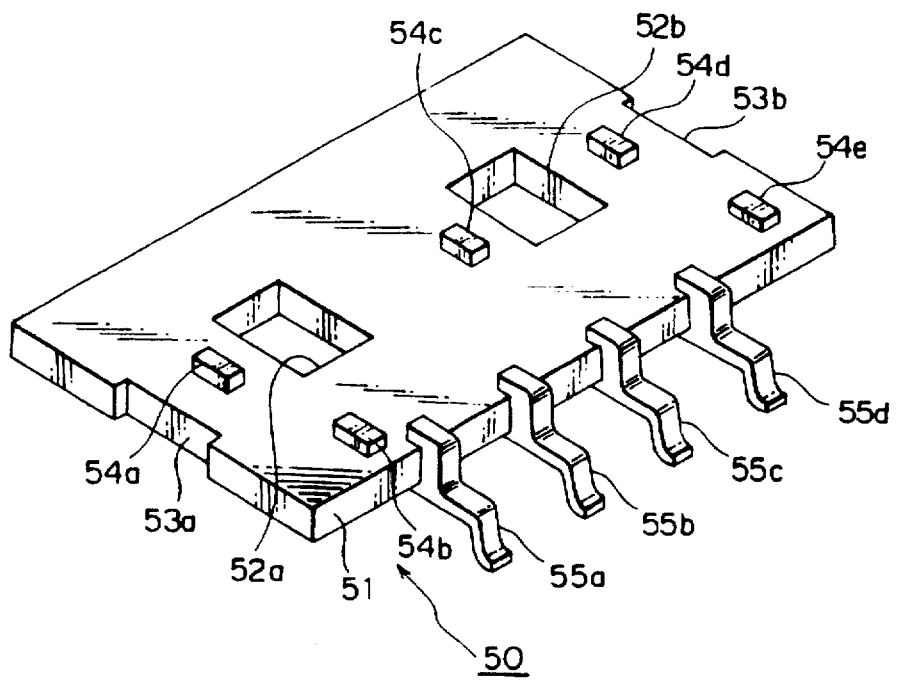
FIG. 7 is a perspective view to show the structure of the wiring substrate included in the power amplifying module of FIG. 1.

Next, as shown in FIG. 7, the wiring substrate 50 is mounted on the stem, is covered by the cap, and is electrically connected with the two semiconductor chips, thus composing the power amplifying circuit. This wiring substrate 50 has the substrate body 51 made in a nearly thin plate shape and of an insulating material, and five electronic device components 54a–54e set on the top surface of the substrate body 51. Four input/output lead pins 55a–55d are provided on the side portion of the substrate body 51 as being fixed on the top surface and on the bottom surface of the substrate body 51 and extending to the outside so as to project through the lead pin passing portion 42 of the cap 40.

The substrate body 51 is made, for example, of an inorganic material including alumina, glass, or the like, a glass fabric/epoxy resin laminate material including PPO (2, 5-diphenyloxazole), or the like. Two through holes 52a, 52b are formed through the substrate body 51 so as to penetrate between the top surface and the bottom surface thereof. At the longitudinally outside ends of the substrate body 51, the two stem engaging portions 53a, 53b are formed as being cut in a nearly rectangular parallelepiped shape and being engaged with the two substrate clamping portions 33a, 33b of the stem 30 to be clamped thereby.

The four input/output lead pins 55a–55d are metal clip type lead pins fixed as clamping the top surface and bottom surface of the substrate body 51, which are made, for example, of phosphor bronze.

The electronic circuit pattern of the substrate body 51 is wiring of a metal thin film made of Cu. This electronic circuit pattern electrically connects the two semiconductor chips 70a, 70b, the five electronic device components 54a–54e, and the four input/output lead pins 55a–55d, thus constructing the power amplifying circuit.

Figure 8:
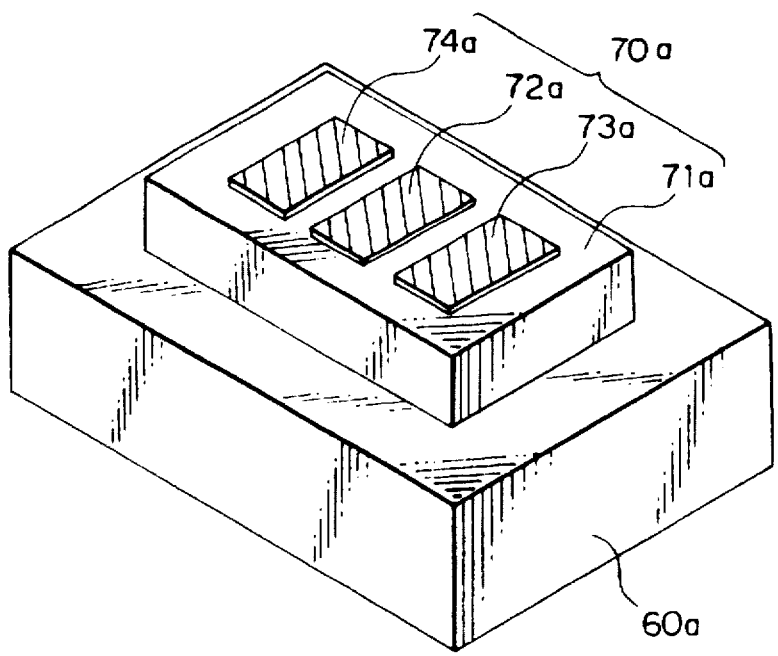
FIG. 8 is a perspective view to show the structure of the heat spreader and semiconductor chip included in the power amplifying module of FIG. 1.

Next, as shown in FIG. 8, the heat spreader 60a is a metal chip mount table fixed on the stem 30 at the exposed portion through the through hole 52a of the wiring substrate 50. Also, the heat spreader 60b is constructed substantially in the same manner as the heat spreader 60a, and is thus a metal chip mount table fixed on the stem 30 at the exposed portion through the through hole 52b of the wiring substrate 50. These two heat spreaders 60a, 60b are fixed on the stem 30 with an adhesive having relatively high heat resistance. The heat spreaders 60a, 60b are made of a material having a larger thermal conductivity than that of the substrate body 51 of the wiring substrate 50; for example, they are made of Cu or CuW.

Further, as shown in FIG. 3, the semiconductor chip 70a is an FET (Field Effect Transistor) in a bare chip form, fixed on the top surface of the heat spreader 60a and wire bonded to the electronic circuit pattern of the substrate body 51 by wires 70c. This semiconductor chip 70a is composed of a semi-insulating substrate 71a made of a compound semiconductor, in a surface region of which an active layer (not shown) having the n-type or p-type conduction is formed by ion implantation, a metal gate electrode 72a provided in Schottky contact on the gate region of the active layer of the semi-insulating substrate 71a, a metal source electrode 73a provided in ohmic contact on the source region of the active layer of the semi-insulating substrate 71a, and a metal drain electrode 74a provided in ohmic contact on the drain region of the active layer of the semi-insulating substrate 71a.

Also, the semiconductor chip 70b is constructed substantially in the same manner as the semiconductor chip 70a, and is an FET in a bare chip state as being fixed on the top surface of the heat spreader 60b and being bonded to the electronic circuit pattern of the substrate body 51 by wires 70d. Namely, this semiconductor chip 70b is composed of a semi-insulating substrate 71b of a compound semiconductor, in a surface region of which an active layer (not shown) having the n-type or p-type conduction is formed, a metal gate electrode 72b provided in Schottky contact on the gate region of the active layer of the semi-insulating substrate 71b, a metal source electrode 73b provided in ohmic contact on the source region of the active layer of the semi-insulating substrate 71b, and a metal drain electrode 74b provided in ohmic contact on the drain region of the active layer of the semi-insulating substrate 71b.

The two semiconductor chips 70a, 70b are electrically connected to the electronic circuit pattern of the substrate body 51 and constituting the power amplifying circuit together with the five electronic device components 54a–54e and four input/output lead pins 55a–55d. The two semi-insulating substrates 71a, 71b are made of the compound semiconductor material having relatively large bandgap energy; for example, they are made of GaAs. The active layers of these two semi-insulating substrates 71a, 71b each are made as doped with impurity ions by the ordinary ion implantation technique. The two gate electrodes 72a, 72b each are made, for example, of Ti/Pt/Au, and the two source electrodes 73a, 73b and the two drain electrodes 74a, 74b are made, for example, of AuGe alloy.

As shown in FIG. 3, the height of the semiconductor chip 70a and heat spreader 60a is desirably determined to be nearly equal to the height (thickness) of the substrate body 51. This enables good wire bonding between the semiconductor chip 70a and the electronic circuit pattern of the substrate body 51. Further, since the wire length is shortened, a deterioration of the high-frequency characteristics can be suppressed.

Next explained is the operation of the power amplifying module 10.

In the power amplifying module 10, the wiring substrate 50 provided inside the package 20 is made to have the two through holes 52a, 52b penetrating between the top surface of the substrate body 51 on which the electronic circuit pattern (not shown) is formed and the bottom surface of the substrate body 51 in contact with the inner surface of the stem 30. The heat spreader 60a and semiconductor chip 70a or the heat spreader 60b and semiconductor chip 70b are mounted in order on the inner surface of stem 30 in each exposed portion through these two through holes 52a, 52b.

These two semiconductor chips 70a, 70b are electrically connected to the electronic circuit pattern of the substrate body 51 through wires 70c and 70d and constitute the power amplifying circuit together with the five electronic device components 54a–54e and the four input/output lead pins 55a–55d. Here, when the two semiconductor chips 70a, 70b each operate as power amplifiers, they generate a lot of heat because of their high output power characteristic.

Each of the stem 30 and cap 40 forming the package 20 and the two heat spreaders 60a, 60b fixed in contact with the stem 30 is made of the material having the larger thermal conductivity than that of the material making the substrate body 51. This causes the heat generated by the two semiconductor chips 70a, 70b to successively conduct through the each heat spreaders 60a, 60b, the stem 30, and the cap 40 with rarely conducting to the substrate body 51, and to be emitted to the outside of the package 20 at high efficiency.

Therefore, the five electronic devices 54a–54e, forming the power amplifying circuit together with the two semiconductor chips 70a, 70b and the four input/output lead pins 55a–55d as being electrically connected with the electronic circuit pattern of the substrate body 51, are thus protected from the heat generated by the two semiconductor chips 70a, 70b. Thus, they can operate stably as keeping the temperature thereof almost constant and they are free of decreases of the operating speed and the life due to an increase of the temperature. Accordingly, the power amplifying circuit composed of the two semiconductor chips 70a, 70b, the five electronic devices 54a–54e, and the four input/output lead pins 55a–55d can fully demonstrate its high output power characteristic without being degraded.

Next explained is measurement of heat radiation characteristics with an experimental example the power amplifying module 10 according to the present embodiment.

The power amplifying module of the present experimental example was based on the following specifications.
Wiring substrate:
  material PPO,
  thickness 0.63 mm,
  coefficient of linear expansion 20 ppm/K
  relative dielectric constant 10.4

Heat spreaders:
  material Cu,
  thickness 0.56 mm,
  thermal conductivity 3.9 W/cm•K,
  coefficient of linear expansion 17 ppm/K,
Stem:
  material Cu,
  thickness 0.6 mm,
  thermal conductivity 3.9 W/cm•K,
  coefficient of linear expansion 17 ppm/K The thermal resistance was repetitively measured, and the results were from 14.7 to 16.6 K/W, where thermal resistance θ[K/W] of power amplifying module is defined by the following equation.

$$\theta = \Delta T / Q$$

where $\Delta T$ is a difference between the temperature at the junction in the semiconductor chip and the ambient temperature of package, and Q is the consumption power [W] of the power amplifying module.

Figure 9:
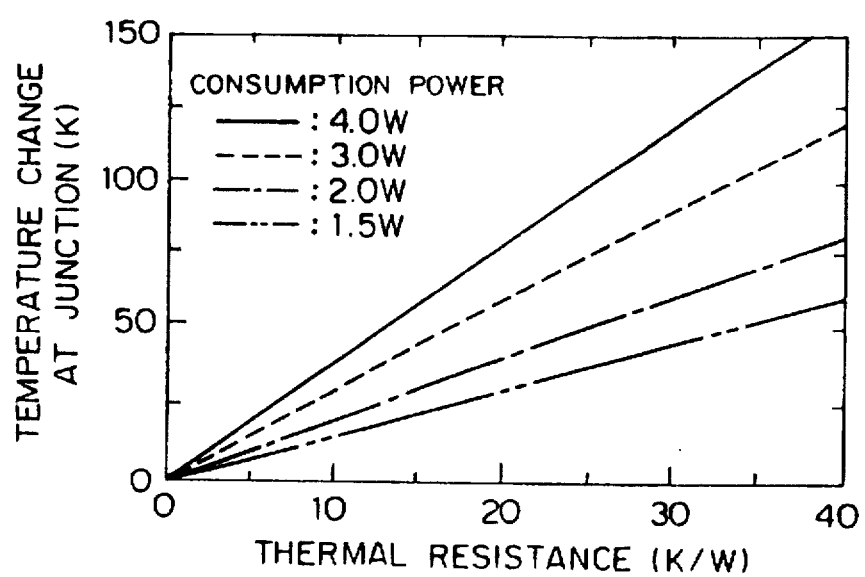
FIG. 9 is a diagram to show characteristics of thermal resistance versus channel temperature change for various consumption powers in order to evaluate the thermal resistance of an experimental example in the power amplifying module according to the present invention.
Figure 10A:
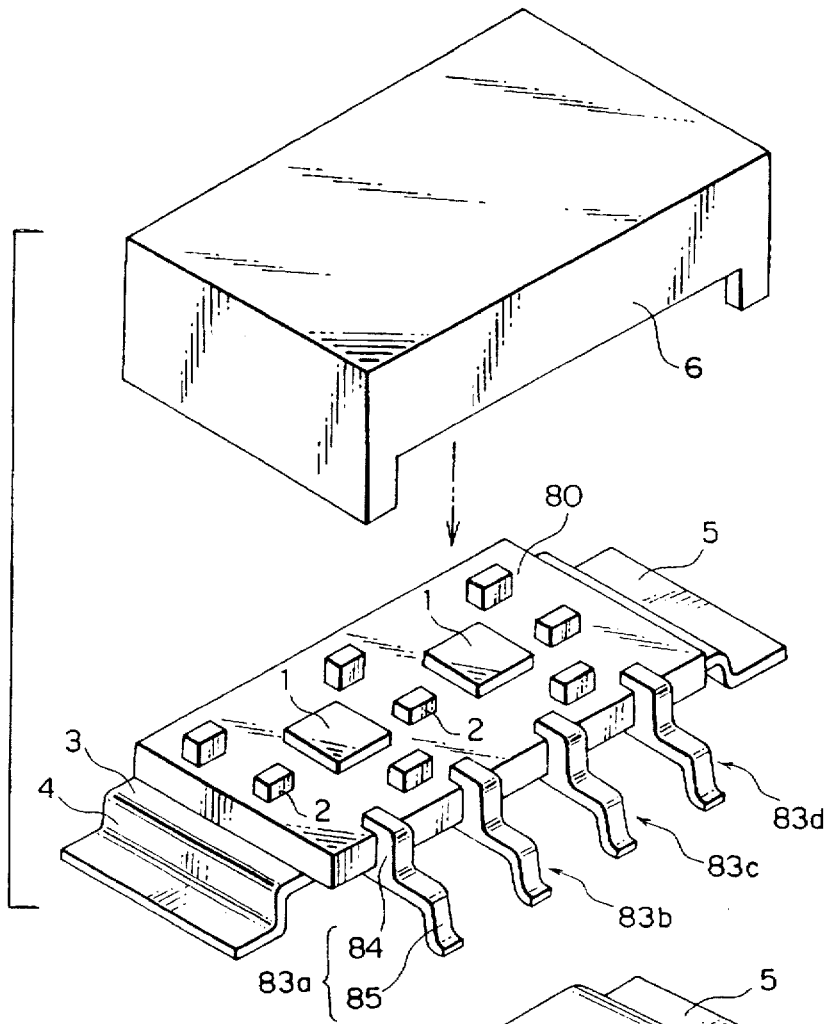
FIG. 10A is an exploded perspective view to show the conventional module electronic component.
Figure 10B:
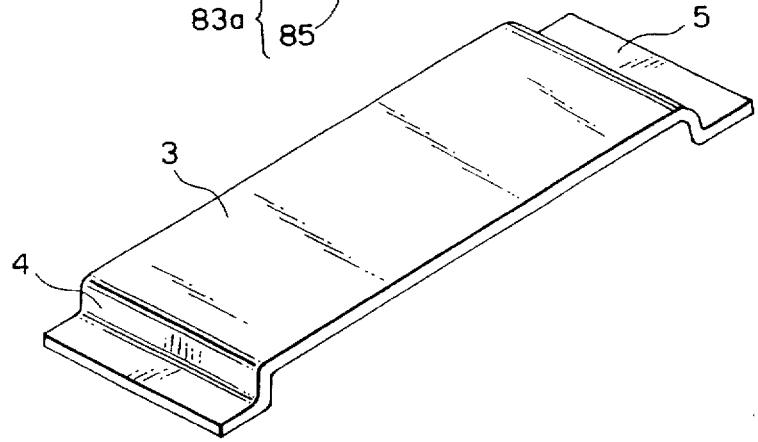
FIG. 10B is a perspective view of the package substrate of the module electronic component shown in FIG. 10A.

If the ambient temperature of package and the consumption power of power amplifying module are constant, the temperature difference at the junction of semiconductor chip has a proportional relation to the thermal resistance of the power amplifying module, as shown in FIG. 9.

FIG. 9 is a diagram to show the characteristics of thermal resistance versus channel temperature change for the various power consumption in order to evaluate the thermal resistance of the experimental example of the power amplifying module according to the present invention. In FIG. 9, the power consumption of the module is set to be 1.5 W, 2.0 W, 3.0 W, or 4.0 W.

When the semiconductor chips are FETs, it is necessary to maintain the channel temperature of FET below 130° C. in order to operate the FETs. Since the ambient temperature of package is at most 80° C. in the original circumstances, it is required to keep the channel temperature difference of FET below 50° C. in order to operate them in a original condition.

In order to meet this restriction on the channel temperature difference of FET, the PHS (Plated Heat Sink) structure as of the used attained by making the semi-insulating substrate in a thin plate shape and then plating Au on the back surface thereof. However, as apparent from FIG. 9, the temperature change at junction are 50° C. or less in cases of 3 W or less of the power consumption. Therefore, the thermal resistance of the present invention satisfies the above condition on the channel temperature change of FET for the power consumption of approximately 3 W or less.

As explained above, the power amplifying module of the present invention is arranged in such a manner that the heat spreader and the semiconductor chip in a bare chip form are set in order on the inner surface of the package exposed through the at least one through hole formed in the wiring substrate. The semiconductor chips, electrically connected with the electronic circuit pattern of the wiring substrate to form the power amplifying circuit, generate a lot of heat because of their high output power characteristic when operating as power amplifiers.

Since each of the package and heat spreaders is made of the material having the larger thermal conductivity than that of the forming material of the wiring substrate, the heat generated by the semiconductor chips is successively conducted through the heat spreaders and package to be emitted to the outside of the package at high efficiency. By this, the various electronic devices, forming the power amplifying circuit together with the semiconductor chips as being electrically connected with the electronic circuit pattern, are protected from the heat generated by the semiconductor chips, and they can operate stably as maintaining the temperature thereof almost constant.

Accordingly, even if the wiring substrate is made of a material having a relatively small thermal conductivity such as alumina or the glass epoxy resin, the power amplifying module of the present invention can emit the heat generated by the semiconductor chips to the outside of the package soon, whereby high performance can be achieved more easily than with the conventional modules.

It is noted here that the present invention is by no means limited to the above-stated embodiment, but may have various modifications. For example, in the embodiment stated above, the heat spreaders are made of the material Cu or CuW, and the package is made of the material Cu or FeNi alloy. However, any other various materials may be employed as the materials for forming the heat spreaders and package as long as they have larger thermal conductivities than that of the forming material of the substrate body.

In the embodiment stated above, the semiconductor chips are the FETs. However, any other various electronic devices may be applied as the semiconductor chips as long as they can function as power amplifiers when electrically connected to the electronic circuit pattern of the wiring substrate.

Further, the two through holes are formed in the wiring substrate in the above-stated embodiment. However, only one through hole or many through holes may be formed in the wiring substrate. This permits the heat spreader and semiconductor chip to be successively positioned on the inner surface of the stem exposed through each through hole.

It is noted that the semiconductor chips 70a, 70b may be high-frequency transistors having excellent characteristics especially in high-frequency region. Namely, the power amplifying module can be obtained high reliability as well as excellent electrical characteristics in the quasi microwave band, for example in the frequency band of from 0.5 GHz to 3 GHz. Further, the height between the semiconductor chips and heat spreaders is desirably determined to be nearly equal to the height (thickness) of the substrate body 51. This permits good wire bonding to be made between the semiconductor chips and the electronic circuit pattern formed on the wiring substrate.

As explained above, the present embodiment is arranged in such a manner that the thickness of the substrate supporting portion 31 is equal to the bending of the lead pin 55a, which is a distance between the reverse surface of the wiring substrate 50 and the surface of the substrate of an electric device. Also, the stem 30 is not in contact with the lead pin 55a. Therefore, the wiring substrate 50 can be held stably and in parallel with respect to the substrate of an electronic device when the final module is set on the substrate of the electronic device or the like. Especially, no undesirable mechanical stress will be loaded on the substrate body 51 on which the electronic circuit is formed. Further, since the substrate supporting portion 31 can easily be kept in close contact with the bottom surface of the substrate body 51 and with the substrate of the electronic device, the heat radiation effect can be improved, and in turn, the module electronic component with high reliability, for example, the power amplifying module with high reliability, can be provided.

Explained with this embodiment was the so-called single in-line type module in which the lead pins are formed on one side end of the substrate body, but the present invention can also be applied to dual in-line type modules in which the lead pins are formed on the both sides of the substrate body. It is noted that the present invention is by no means limited to the power amplifying modules, but may also be applied to electronic components in a wide area.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 156126/1995 filed on Jun. 22, 1995, and 250987/1995 filed on Sep. 28, 1995, are hereby incorporated by reference.

What is claimed is:

1. A power amplifying module comprising:
   a wiring substrate on a principal surface of which an electronic circuit pattern is formed and in which one through hole is formed as penetrating between the principal surface and a back surface thereof;
   a metal package substrate on which said wiring substrate is mounted, said metal package substrate having a two substantially flat surfaces opposite to each other through said metal package substrate;
   a heat spreader mounted on one of said flat surfaces of said metal package substrate and exposed through the through hole provided in said wiring substrate;
   a semiconductor chip mounted in a bare chip form on a surface of the heat spreader and electrically connected to the electronic circuit pattern of said wiring substrate to form a power amplifying circuit;
   a plurality of lead pins fixed to an end of said wiring substrate and each extending from the end of the wiring substrate downward, the lowest portions of said lead pins being substantially on the same plane as the other flat surface of said metal package substrate; and
   each of said metal package substrate and said heat spreader is made of a material having a thermal conductivity larger than that of a material of said wiring substrate.

2. A power amplifying module according to claim 1, wherein a sum of thicknesses of said heat spreader and said semiconductor chip is substantially equal to a thickness of said wiring substrate.

3. A power amplifying module according to claim 1, wherein a material of said heat spread is one of Cu and CuW.

4. A power amplifying module according to claim 1, wherein a material of said metal package substrate is one of Cu and FeNi alloy.

5. The power amplifying module according to claim 1, wherein said semiconductor chip is a field effect transistor.

6. A power amplifying module according to claim 1, further comprising:
   a package cap for housing said wiring substrate inside and fixed to said metal package substrate, wherein said metal package substrate is bonded on said wiring substrate without contacting said plurality of lead pins.

7. A power amplifying module according to claim 1, wherein said wiring substrate has two side edges opposite to each other and at least one of said plurality of lead pins are fixed to one side edge of said wiring substrate.

8. A power amplifying module according to claim 1, wherein said wiring substrate has two side edges opposite to each other and at least one of said plurality of lead pins are fixed to the both side edges of said wiring substrate.

* * * * *